United States Patent [19]

Lewis et al.

[11] 4,201,337

[45] May 6, 1980

[54] DATA PROCESSING SYSTEM HAVING ERROR DETECTION AND CORRECTION CIRCUITS

[75] Inventors: Wayne J. Lewis, Escondido; William P. Ward, Poway, both of Calif.

[73] Assignee: NCR Corporation, Dayton, Ohio

[21] Appl. No.: 939,298

[22] Filed: Sep. 1, 1978

[51] Int. Cl.² .......................................... G06F 11/12
[52] U.S. Cl. ......................................................371/37
[58] Field of Search ............................. 235/303.2, 312; 340/146.1 AL

[56] References Cited

U.S. PATENT DOCUMENTS

| | | | |
|---|---|---|---|
| 3,568,153 | 3/1971 | Kurtz et al. | 235/303.2 |
| 3,836,957 | 9/1974 | Duke et al. | 340/146.1 AL |
| 3,893,071 | 7/1975 | Bossen et al. | 340/146.1 AL |
| 3,949,208 | 4/1976 | Carter | 235/303.2 |
| 4,077,565 | 3/1978 | Nibby, Jr. et al. | 235/312 |
| 4,139,148 | 2/1979 | Sheuneman et al. | 235/312 |

Primary Examiner—Charles E. Atkinson
Attorney, Agent, or Firm—J. T. Cavender; Edward Dugas; Stephen F. Jewett

[57] ABSTRACT

A data processing system implemented in LSI includes error detection and correction (EDC) circuits operating either in an error correction code (ECC) mode by generating ECC parity bits, or a byte parity mode by generating or checking byte parity bits. Each EDC circuit is identical and is capable of delivering identical control signals to byte sliced memory interface chips for purposes of error correction. The EDC circuits may be used individually with a 32 bit data bus or may be combined for use with a 64 bit data bus.

13 Claims, 10 Drawing Figures

DATA PROCESSING SYSTEM HAVING ERROR DETECTION AND CORRECTION CIRCUITS

BACKGROUND OF THE INVENTION

The present invention relates to data processing systems, and more particularly, to the detection and correction of data errors in such systems.

In designing a system implemented in LSI (large scale integration), it has been found desirable to limit the number of different types of LSI chips within the system. The production of a mask to manufacture each LSI chip-type requires a large amount of design effort and expense in order to arrange the large number of components on the chip and to provide the connections on the chip between such components. Unless production costs are minimized by limiting the total number of different LSI chip-types, an LSI system is not cost competitive with systems implemented in MSI (medium scale integration) or SSI (small scale integration).

A problem associated with LSI chips is that a large number of input/output pins are often required because of the large number of circuit components and the input and output signals used in connection with such components. If the number of pins exceeds the maximum number which may be physically mounted on the chip, techniques are required for spreading functions or operations among several identical chips. Thus, in the case where several bytes of data are operated on at one time as a single data word, the data may be "sliced", for example in bytes, with an identical LSI data chip for receiving each byte in the data word and operating on each byte individually.

When a circuit for detecting or correcting data errors is implemented in LSI, it is desirable that the same circuit be capable of use at any location in the system where error detection or correction is needed. Furthermore, the circuit must also be capable of delivering control signals to each of the LSI data chips which receive slices of data so that each of the data chips may be constructed identically, even though they may be controlled individually.

SUMMARY OF THE INVENTION

In accordance with the present invention, a plurality of identical error detection and correction circuits are used in a data processing system implemented in large scale integration. The error correction code (ECC) in accordance with which each error detection and correction circuit operates is a modified Hamming code so chosen that each error detection and correction circuit may generate either ECC parity bits for single error correction and double error detection, or generate byte parity bits for byte error detection. The chosen code permits the generation of syndrome bits for correcting single bit errors, with the same group of syndrome bits delivered to each of plural data "sliced" data chips when correcting the bit in error, so that each of the data chips may be constructed identically.

The error detection and correction circuit made in accordance with the present invention can be used at various locations within a data processing system where error detection, or error detection and correction, is desired. The circuit thus fulfills the need to limit the number of LSI chip-types in a data processing system. Furthermore, the error detection and correction circuit is compatible with an LSI system having plural identical data sliced data chips since the control inputs and the control logic or circuitry of each of the data chips are identical.

It is therefore an object of the present invention to provide an error detection and correction circuit which may be used in a data processing system implemented in LSI.

It is another object of the present invention to provide a data processing system that uses the same error detection and correction circuit at various locations in the data processing system, to provide either parity error detection, or single error correction and double error detection.

It is another object of the present invention to provide an error detection and correction circuit that may be used in connection with different data buses carrying different numbers of bytes of data.

It is still another object of the present invention to provide a data processing system having identically constructed chips receiving slices of data from a data bus, and having an error detection and correction circuit for use with such a data bus.

These and other objects of the present invention will become more apparent when taken in conjunction with the following description and drawings throughout which like characters indicate like parts and which drawings form a part of the present application.

DESCRIPTION OF THE PREFERRED EMBODIMENT

Figure 1:
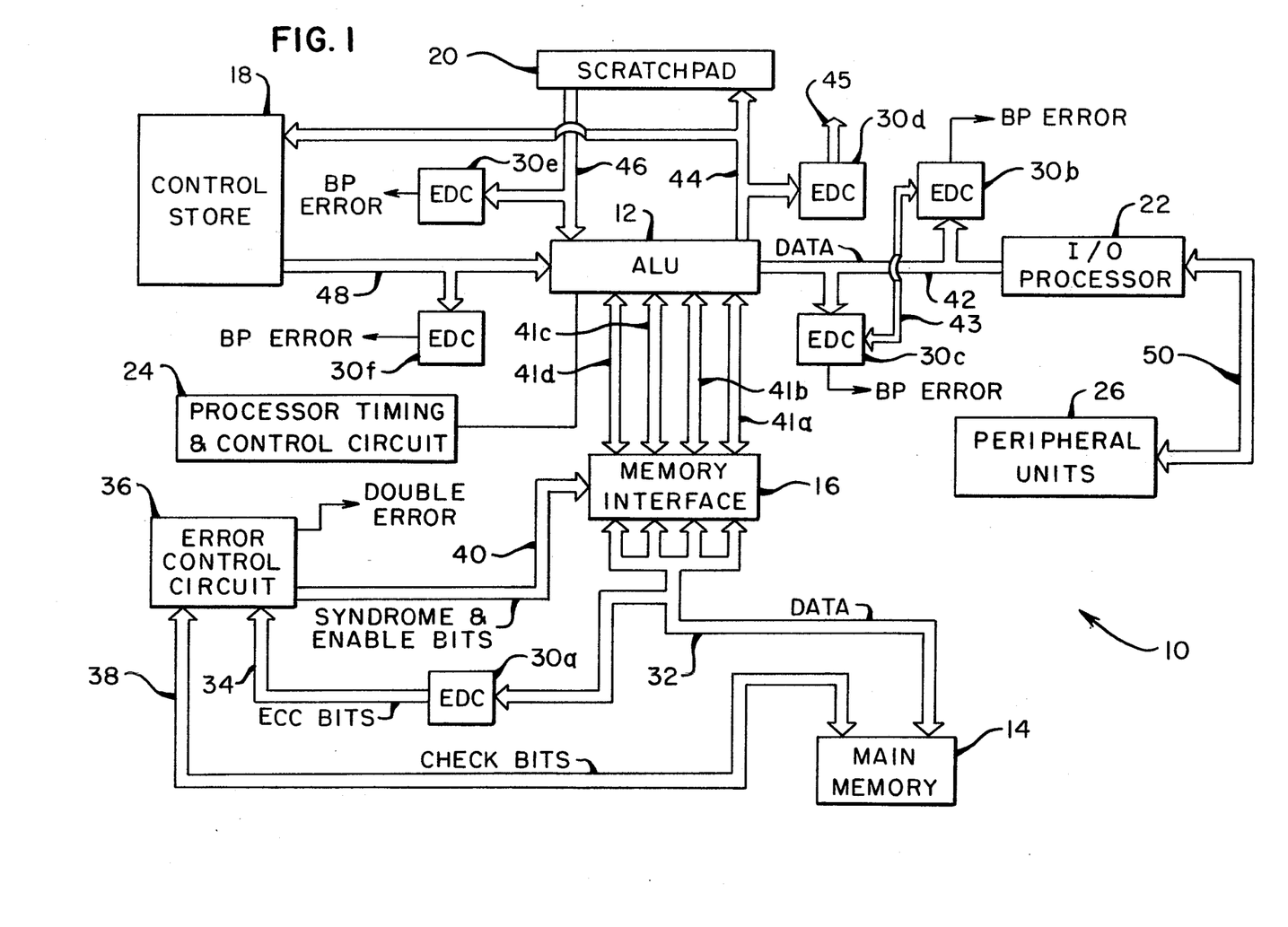
FIG. 1 is a simplified block diagram illustrating a data processing system and the manner in which an error detection and correction circuit made in accordance with the present invention may be used at various locations in the data processing system.

Referring now to FIG. 1, a typical microprocessor-based data processing system 10 is shown. The data processing system 10 includes an arithmetic-logic unit (ALU) 12 which is connected by control and data buses to a main memory 14 by way of a memory interface 16, to a control store 18, to a scratch pad memory 20 and to an input/output (I/O) processor 22.

During normal operation, the ALU 12, as part of a processor, receives instructions and data from the main memory 14. The instructions are decoded and cause a microprogram stored in control store 18 to be selected. The system operates in accordance with the selected microprogram in order to execute each instruction from main memory. The necessary signals to control the sequencing of each component of the system 10 during the execution of each instruction are provided by a processor timing and control circuit 24, and there may be access, through the I/O processor 22 and a bus 50, to peripheral units 26 such as card readers, disc memories, operator consoles, printers, or the like. The ALU performs any necessary arithmetic or logic operations on data and may temporarily store data in the scratch pad memory 20.

As is common in data processing systems implemented in LSI, the ALU 12 and memory interface 16 receive groups or byte-slices of data, with the illustrated ALU and memory interface each comprised of four identical integrated circuit chips, and with each chip receiving and operating on one byte of data.

In accordance with the present invention, error detection and correction (EDC) circuits, designated 30a through 30f, are connected at various locations along the data buses that interconnect the components of the system 10. Each of the EDC circuits is implemented in LSI and is identical. As will be more fully described later, each of the EDC circuits is capable of receiving 32 bits of data, and in response generating byte parity bits for byte parity error detection or generating ECC parity bits for single error correction and double error detection (SEC/DED).

In FIG. 1, EDC circuit 30a operates in an ECC mode and is connected to receive the 32 bits of data from a bus 32 that transfers data between a location at the memory interface 16 and a location at the main memory 14. The EDC circuit 30a generates seven ECC parity bits which are provided by way of a bus 34 to an error control circuit 36. The error control circuit 36 either passes the generated ECC parity bits onto main memory 14 by way of a bus 38 as check bits to be stored with the data, or compares the ECC parity bits with the check bits coming from main memory along bus 38 to determine if an error has occurred in the data fetched from memory.

If a single error has been made in the data, the error control circuit 36 generates appropriate syndrome and enabling bits along a bus 40 to the memory interface to correct the bit in error before being passed along one of four busses 41a, 41b, 41c and 41d to ALU 12. If a double error has been made, a DOUBLE ERROR signal is generated by the error control circuit 36 which can, for example, be delivered to the processor timing and control circuit 24 to cause the data to be fetched again from memory.

The EDC circuits 30b and 30c are each operated in a byte parity mode and are used to both generate and check byte parity bits. EDC circuit 30b generates byte parity bits on a bus 43 for data leaving the I/O processor 22 along a bus 42 and receives byte parity bits from bus 43 for checking the byte parity of the data carried on the bus 42 from the ALU 12 to the I/O processor 22. The EDC circuit 30c generates byte parity bits on the bus 43 for data carried on bus 42 from the ALU to the I/O processor and receives byte parity bits from EDC circuit 30b on bus 43 for checking the byte parity of data carried on bus 42 from the I/O processor to the ALU.

The EDC circuits 30d, 30e and 30f also operate in a byte parity mode. EDC circuit 30d generates byte parity bits on a bus 45 for data sent to the scratch pad memory 20 and control store 18 along a bus 44, and the EDC circuit 30e checks the byte parity of data on a bus 46 returning from the scratch pad memory 20. EDC circuit 30f checks the byte parity of data on a bus 48 returning from the control store 18. Each of the EDC circuits 30b, 30c, 30e, and 30f generate an error signal (BP ERROR) when a byte parity error is detected.

It should be understood that the manner in which the EDC circuits 30a through 30f are shown is only exemplary, and that a typical data processing system will normally have more EDC circuits than those shown. The actual operation of the EDC circuits 30a through 30f will be explained in more detail in connection with FIGS. 2, 3, 4, 5 and 6.

Figure 2:
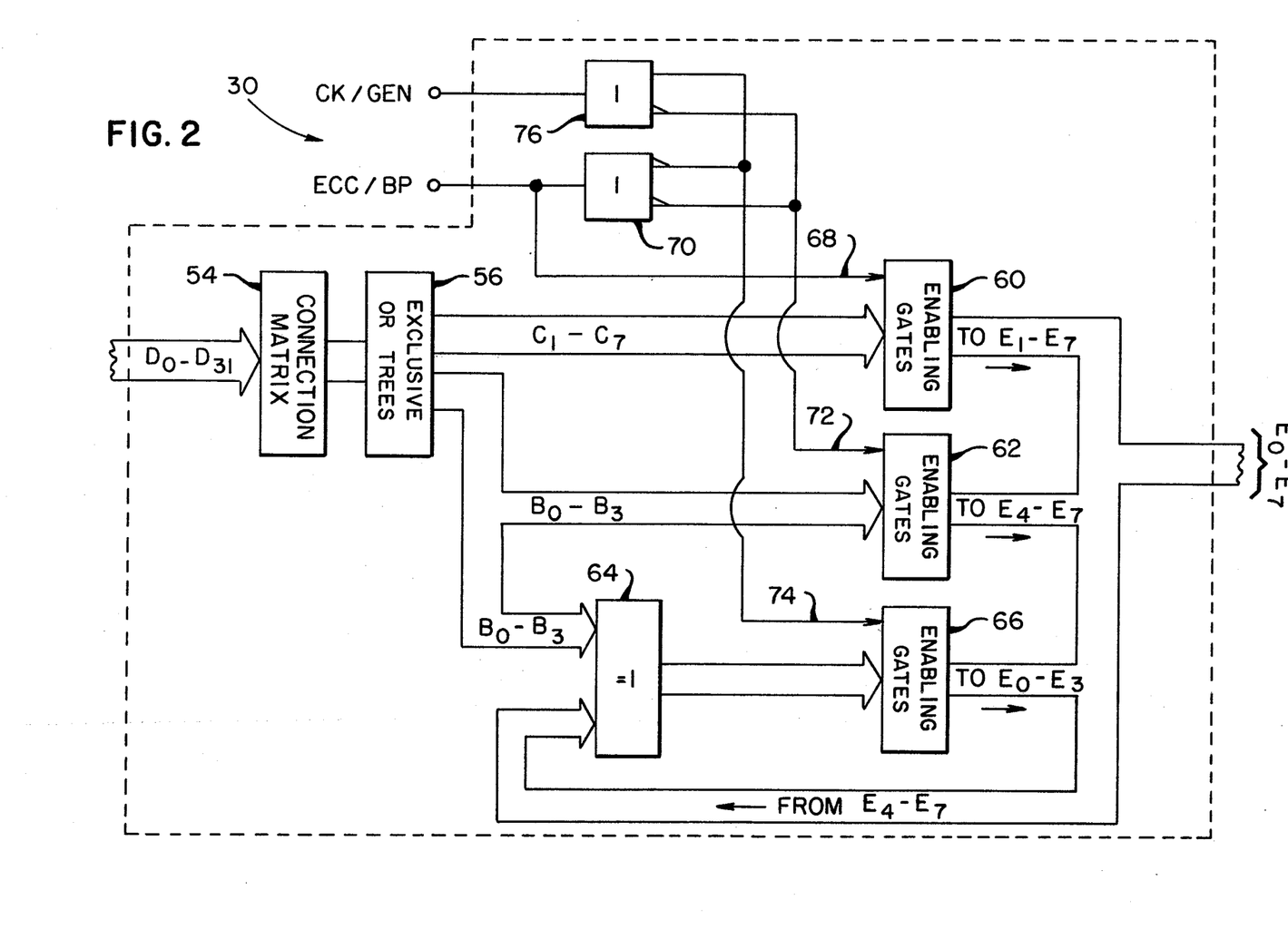
FIG. 2 is a block diagram of the error detection and correction circuit illustrated in FIG. 1.

Referring now to FIG. 2, there is shown a block diagram of an EDC circuit 30, which could be used for any one of the EDC circuits 30a through 30f illustrated in FIG. 1. The EDC circuit 30 has data input terminals for receiving 32 bits of data, designated $D_0$ through $D_{31}$. The EDC circuit 30 also has eight parity bit terminals, designated $E_0$ through $E_7$, and two control inputs, designated CK/GEN and ECC/BP.

The data bits $D_0$ through $D_{31}$ are received by a connection matrix 54 which, in turn, connects the data lines to a group of EXCLUSIVE OR trees, designated 56. The connection matrix 54 and the EXCLUSIVE OR trees 56 together cause the data bits $D_0$ through $D_{31}$ to be logically combined to generate ECC parity bits in accordance with the modified Hamming code illustrated by the H-parity check matrix of FIG. 3.

Figure 3:
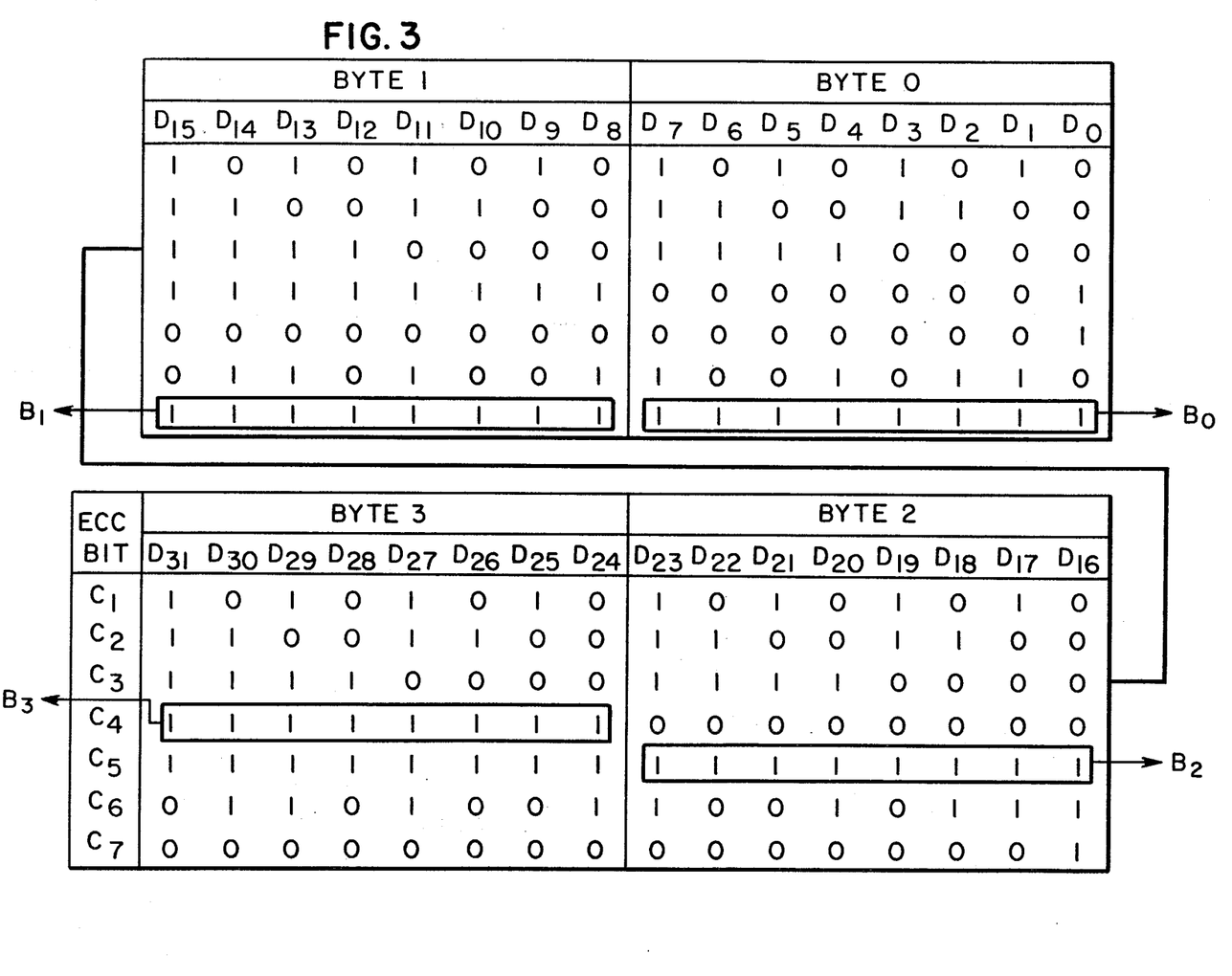
FIG. 3 is an H-parity check matrix illustrating the modified Hamming code used in the error detection and correction circuit of FIG. 2.
Figure 4:
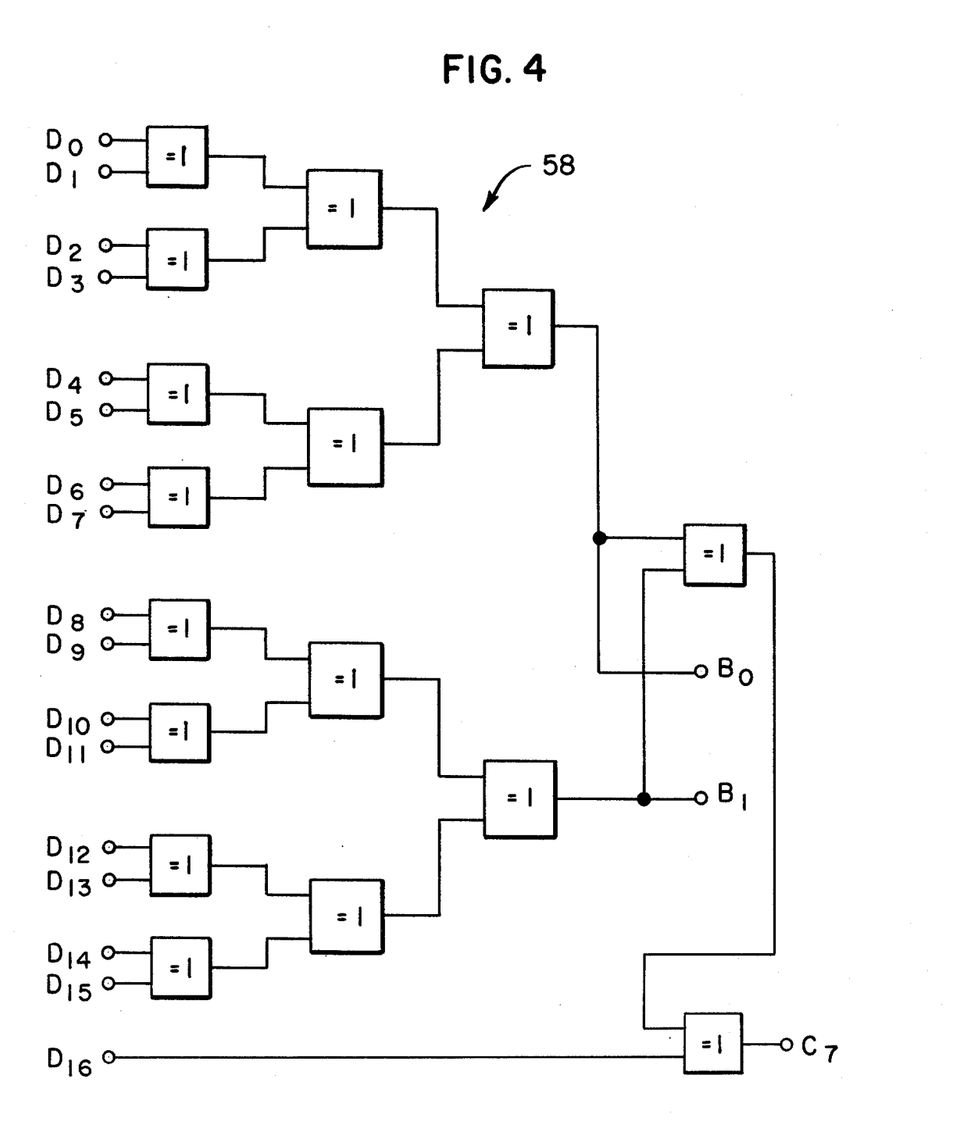
FIG. 4 is a logic diagram illustrating the EXCLUSIVE OR tree for generating $C_7$.

Turning momentarily away from FIG. 2 and referring to FIGS. 3 and 4, the H-matrix of FIG. 3 illustrates by its patterns of "ones" and "zeros" the particular data bits which will be combined to generate each error correction code (ECC) bit. A "one" indicates that the corresponding data bit is included in the combination of data bits to generate an ECC bit, and a "zero" indicates that the corresponding data bit is not included in the combination. It should be noted that the "ones" and "zeroes" in the H-matrix do not represent logic levels.

Table I below shows the logical equations represented by the rows of the H-matrix for generating each of the ECC parity bits $C_1$ through $C_7$.

Table I $C_1 = D_1 \oplus D_3 \oplus D_5 \oplus D_7 \oplus D_9 \oplus D_{11} \oplus D_{13} \oplus D_{15} \oplus D_{17} \oplus D_{19} \oplus D_{21} \oplus D_{23} \oplus D_{25} \oplus D_{27} \oplus D_{29} \oplus D_{31}$ $C_2 = D_2 \oplus D_3 \oplus D_6 \oplus D_7 \oplus D_{10} \oplus D_{11} \oplus D_{14} \oplus D_{15} \oplus D_{18} \oplus D_{19} \oplus D_{22} \oplus D_{23} \oplus D_{26} \oplus D_{27} \oplus D_{30} \oplus D_{31}$ $C_3 = D_4 \oplus D_5 \oplus D_6 \oplus D_7 \oplus D_{13} \oplus D_{14} \oplus D_{15} \oplus D_{20} \oplus D_{21} \oplus D_{22} \oplus D_{23} \oplus D_{28} \oplus D_{29} \oplus D_{30} \oplus D_{31}$ $C_4 = D_0 \oplus D_8 \oplus D_9 \oplus D_{11} \oplus D_{12} \oplus D_{13} \oplus D_{14} \oplus D_{15} \oplus D_{24} \oplus D_{25} \oplus D_{26} \oplus D_{27} \oplus D_{28} \oplus D_{29} \oplus D_{30} \oplus D_{31}$ $C_5 = D_0 \oplus D_{16} \oplus D_{17} \oplus D_{18} \oplus D_{19} \oplus D_{20} \oplus D_{21} \oplus D_{22} \oplus D_{23} \oplus D_{24} \oplus D_{25} \oplus D_{26} \oplus D_{27} \oplus D_{28} \oplus D_{29} \oplus D_{30} \oplus D_{31}$ $C_6 = D_1 \oplus D_2 \oplus D_4 \oplus D_7 \oplus D_8 \oplus D_{11} \oplus D_{13} \oplus D_{14} \oplus D_{16} \oplus D_{17} \oplus D_{18} \oplus D_{20} \oplus D_{23} \oplus D_{24} \oplus D_{27} \oplus D_{29} \oplus D_{30}$ $C_7 = D_0 \oplus D_1 \oplus D_2 \oplus D_3 \oplus D_4 \oplus D_5 \oplus D_6 \oplus D_7 \oplus D_8 \oplus D_9 \oplus D_{10} \oplus D_{11} \oplus D_{12} \oplus D_{13} \oplus D_{14} \oplus D_{15} \oplus D_{16}$ The symbol ⊕ represents an EXCLUSIVE OR.

Thus, for example, to generate the ECC bit $C_7$, the equation for the ECC bit $C_7$ in Table 1 and the row corresponding to ECC bit $C_7$ in FIG. 3 show that the data bits $D_0$–$D_{16}$ (represented by "ones" in the matrix) are logically combined, and the data bits $D_{17}$–$D_{31}$ (represented by "zeros" in the matrix) are not included in the combination.

From the above it can be seen that $C_7$ is at a "0" logic level when an even number of the data bits $D_0$–$D_{16}$ are at a "1" logic level, and is at a "1" logic level when an odd number of the data bits are at a "1" logic level. $C_7$ is thus said to have even parity. ECC bits $C_4$, $C_5$ and $C_6$ will also have even parity. $C_1$, $C_2$ and $C_3$, on the other hand, will have odd parity, and those ECC bits are at a "0" logic level when an odd number of the data bits used to generate the ECC bits are at a "1" logic level, and are at a "1" logic level when an even number of the data bits are at a "1" logic level.

The modified Hamming code illustrated by the H-matrix of FIG. 3 and the equations of Table 1 is a code currently in use in the CENTURY Line of electronic data processing equipment, sold by NCR Corporation of Dayton, Ohio.

In FIG. 4, there is shown an EXCLUSIVE OR tree 58 which could be used to generate $C_7$ in accordance with the logical equation for $C_7$ listed in Table I and discussed above. The group of EXCLUSIVE OR trees represented by the block 56 in FIG. 2 will comprise a plurality of such logic trees, one for generating each ECC bit $C_1$–$C_7$.

A description of a connection matrix and a set of EXCLUSIVE OR trees which combine data bits in certain patterns so as to generate ECC bits can be found in a wealth of publications and patents, for example, U.S. Pat. No. 3,648,239, entitled "System For Translating to and from Single Error Correction-Double Error Detection Hamming Code and Byte Parity Code", by William C. Carter et al., and U.S. Pat. No. 3,836,957, entitled "Data Storage System with Deferred Error Detection", by Keith A. Duke, et al. Reference can be had to these patents if a more detailed description is desired. The Duke et al. patent is also noteworthy because it discloses a common circuit generating both ECC parity bits and byte parity bits.

It can be seen from the H-matrix of FIG. 3 and the logic diagram of FIG. 4 that the ECC code can be conveniently used to provide byte parity bits in addition to the ECC bits $C_1$–$C_7$. In FIG. 4, the EXCLUSIVE OR tree 58 generates even byte parity for byte 0 (data bits $D_0$–$D_7$) and byte 1 (data bits $D_8$–$D_{15}$). This is also illustrated by the enclosed portions labeled $B_0$ and $B_1$ in FIG. 3. As also illustrated in FIG. 3, by the enclosed portions labeled $B_2$ and $B_3$, byte parity for bytes 2 and 3 can also be obtained during the generation of the ECC bits $C_5$ and $C_4$, respectively.

Referring again to FIG. 2, the output of the EXCLUSIVE OR trees 56 is shown as the ECC parity bits $C_1$–$C_7$, and the byte parity bits $B_0$–$B_3$. The bits $C_1$–$C_7$ are presented to a set of enabling gates 60, and the byte parity bits $B_0$–$B_3$ are presented to a set of enabling gates 62 and one set of inputs of an EXCLUSIVE OR circuit 64. The seven outputs of the enabling gates 60 are connected to the terminals $E_1$–$E_7$ of the EDC circuit 30. The terminals $E_4$–$E_7$ are bidirectional and are also connected to the outputs of the enabling gates 62 and to a second set of inputs to the EXCLUSIVE OR circuit 64. The output of EXCLUSIVE OR circuit 64 is connected to a set of enabling gates 66, whose four outputs are connected to the terminals $E_0$–$E_3$.

When the EDC circuit 30 is to operate in a byte parity mode, a "1" logic level is applied to the control input ECC/BP. The ECC/BP control output is connected to the control line 68 of the enabling gates 60 and the "1" on control line 68 causes gates 60 to become disabled. The "1" at the ECC/BP input is also applied to an OR gate 70 and causes the inverted outputs of the gate 70 to go to a "0".

When in the byte parity mode (ECC/BP at a "1"), the EDC circuit 30 can be selected either for checking or generating byte parity bits, depending on the signal at the control input CK/GEN, which is connected to the control lines 72 and 74 of the enabling gates 62 and 66 by an OR gate 76. If the signal at CK/GEN is at a "1", the circuit is selected for generating parity and such signal is passed by OR gate 76 to control line 74 to disable the enabling gates 66. Such signal also appears as a "0" at the inverted output of OR gate 76, and is applied to the control line 72 to cause the enabling gates 62 to pass the byte parity bits $B_0$–$B_3$ from the output of the EXCLUSIVE OR trees 56 to the terminals $E_4$–$E_7$.

If the signal at CK/GEN is at a "0", the circuit is selected for checking parity and gates 62 are disabled and gates 66 are enabled. A comparison is made by the EXCLUSIVE OR circuit 64 of each of the byte parity bits $B_0$–$B_3$ generated by the connection matrix 54 and EXCLUSIVE OR trees 56 to each of the corresponding byte parity check bits received on the terminals $E_4$–$E_7$. The result of each bit comparison appears at the four terminals $E_0$–$E_3$, with a "0" indicating a match and no byte parity error, and a "1" indicating a mismatch and a byte parity error in one of the bytes in the data bits $D_0$–$D_{31}$.

When the ECC parity bits are to be generated by the EDC circuit 30, control input ECC/BP is at a "0", and control input CK/GEN is at a "1". Control lines 72 and 74 are at a "1" enabling gates 62 and 66 are disabled. Control line 68 is at a "0", and thus the ECC bits $C_1$–$C_7$ at the output of the EXCLUSIVE OR trees 56 are passed through enabling gates 60 to the terminals $E_1$–$E_7$.

It should be noted that the enabling gates 60, 62 and 66 are comprised of NOR gates in order to be enabled by a "0" on the control lines 68, 72 and 74. Accordingly, the $C_1$–$C_7$ and $B_0$–$B_3$ bits are inverted by the enabling gates and are thus inverted when they appear at the terminals $E_0$–$E_7$.

From the above, it can be seen that the EDC circuit 30 can be selected, by the signals applied at the control inputs CK/GEN and ECC/BP, to generate ECC parity bits or byte parity bits for data bits $D_0$–$D_{31}$, or to perform a byte parity check of the data bits $D_0$–$D_{31}$ by comparing the byte parity check bits provided at terminals $E_4$–$E_7$ with generated byte parity bits $B_0$–$B_3$.

Figure 5:
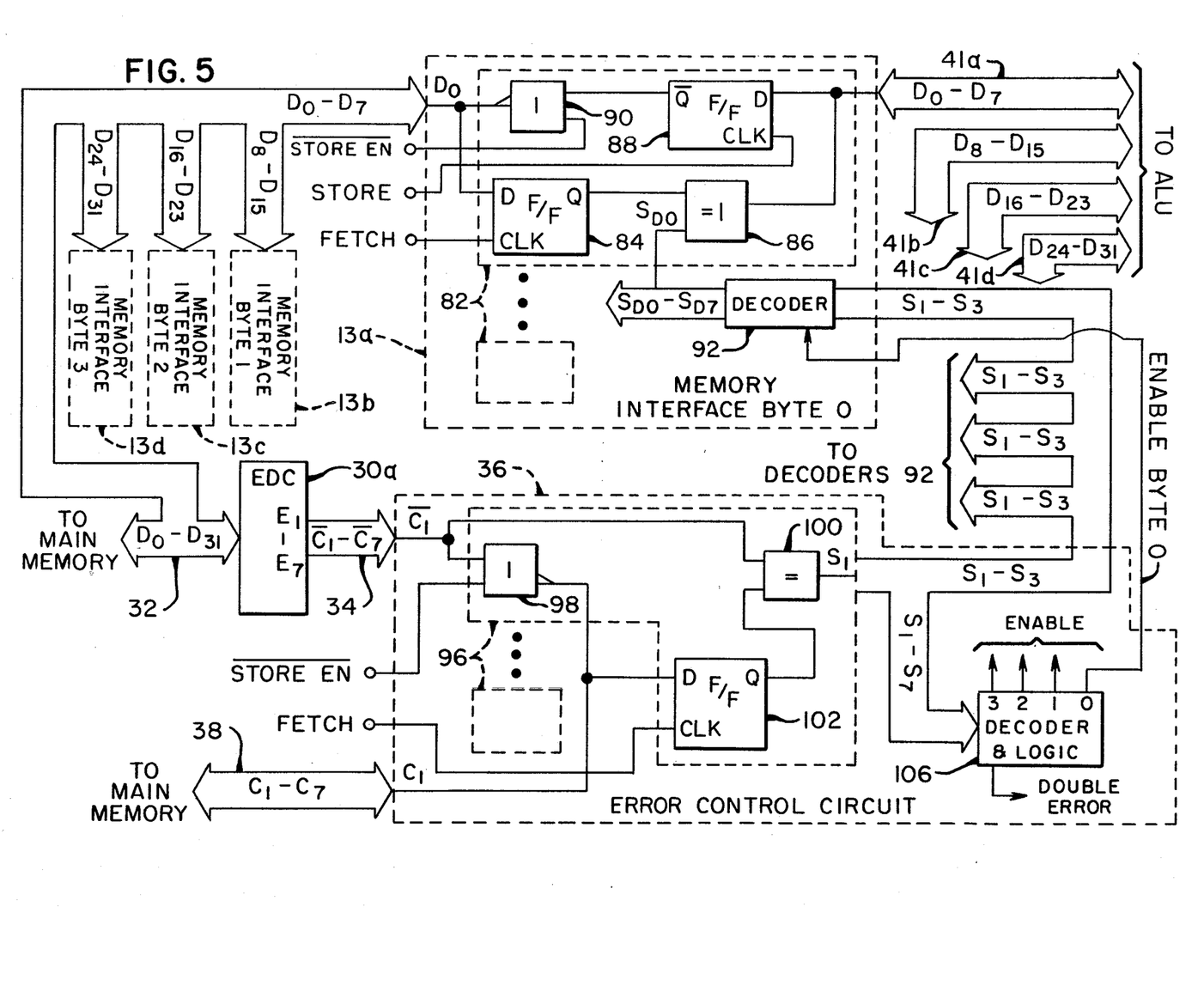
FIG. 5 is a block diagram illustrating the manner in which the error detection and correction circuit is connected when used in an ECC mode.

FIG. 5 shows in greater detail the connection of the EDC circuit 30a in the data processing system 10 of FIG. 1. The EDC circuit 30a operates in an ECC mode, i.e., generating ECC parity bits. The data bus 32 carrying bits $D_0$–$D_{31}$ is connected between the main memory 14 and the EDC circuit 30a, as well as being connected in a byte sliced fashion between the main memory and the memory interface 13. The memory interface 13 is comprised, as illustrated in FIG. 5, of four integrated circuit chips 13a, 13b, 13c and 13d, with only the memory interface chip 13a receiving data byte 0 (bits $D_0$–$D_7$) illustrated in detail. The memory interface chips 13b–13d are identical to 13a, but receive the bytes 1, 2 and 3 and are not illustrated in detail.

The terminals $E_1$–$E_7$ of the EDC circuit 30a provide the inverted ECC parity bits $\overline{C_1}$–$\overline{C_7}$ (terminal $E_0$ is not used), and the bits $\overline{C_1}$–$\overline{C_7}$ are carried by bus 34 to the error control circuit 36. The error control circuit 36 is also connected to bus 38 for carrying the ECC check bits $C_1$–$C_7$ between the main memory and the error control circuit.

The memory interface chip 13a illustrated in FIG. 5 includes a bidirectional bit transfer circuit 82 for receiving each of the data bits $D_0$–$D_7$. Only the bit transfer circuit 82 for receiving the data bit $D_0$ is shown in detail, but it should be understood that in each of the four memory interface chips 13a–13d, there will be eight bit transfer circuits, one for each bit. Each bit transfer circuit 82 transfers its associated data bit between the bus 32 (from main memory) and one of the busses 41a–41d (from the ALU).

The illustrated bit transfer circuit 82 includes a flip-flop 84 having its input D connected for receiving the bit $D_0$ and its output Q connected to one input of an EXCLUSIVE OR gate 86. The input CLK of flip-flop 84 receives a clocking signal FETCH for latching the bit $D_0$ into the flip-flop when data is to be fetched from the main memory to the ALU. The circuit 82 also includes a second flip-flop 88 which has its input D connected to receive the bit $D_0$ from bus 41a. The inverted output $\overline{Q}$ of the flip-flop 88 is connected to one input of a NOR gate 90 which in turn has its output connected for delivering bit $D_0$ to bus 32. When data is to be passed from the ALU for storage in the main memory, the flip-flop 88 receives a clocking signal STORE for latching the bit $D_0$ from bus 41a into the flip-flop, and the NOR gate 90 receives an enabling signal $\overline{\text{STORE EN}}$ for passing the data bit through to bus 32.

A bit decoder 92 in each memory interface chip has eight outputs $S_{D0}$–$S_{D7}$, with one of the outputs provided to the second input of the EXCLUSIVE OR gate 86 in each bit transfer circuit 82, and causing the bit transferred from bus 32 to busses 41a–41d to be inverted under circumstances to be described in detail later.

As illustrated in FIG. 5, the error control circuit 36 includes a bit comparison and transfer circuit, designated 96, for each of the seven inverted ECC parity bits $\overline{C_1}$–$\overline{C_7}$ delivered by the EDC circuit 30a and each of the corresponding check bits $C_1$–$C_7$ delivered by bus 38. Although only the bit transfer circuit for receiving bit $\overline{C_1}$ from bus 34 and bit $C_1$ from bus 38 is illustrated in detail, it should be understood that six other identical bit transfer circuits 96 will also be located in error control circuit 36.

The illustrated bit transfer circuit 96 includes a NOR gate 98 and an EXCLUSIVE NOR gate 100, each having an input for receiving the bit $\overline{C_1}$ from the EDC circuit 30a. A second input of NOR gate 98 receives an enabling signal $\overline{\text{STORE EN}}$ for inverting and passing the ECC parity bit $\overline{C_1}$ when the ECC parity bits generated by the EDC circuit 30a are to be stored in memory with data as ECC check bits. The output of NOR gate 98 is connected to the bus 38. Bus 38 is also connected to the input D of a flip-flop 102. The flip-flop 102 receives a clocking signal FETCH at its input CLK when data is to be fetched from memory to the ALU, causing the check bit $C_1$ from bus 38 to be clocked into the flip-flop 102 and be presented to a second input of the EXCLUSIVE NOR gate 100.

The EXCLUSIVE NOR gate 100 provides a comparison of the ECC parity bit $\overline{C_1}$ generated by the EDC circuit 30a and the ECC check bit $C_1$ carried on bus 38 when data is fetched from the main memory. The comparison of each ECC parity bit and ECC check bit by the EXCLUSIVE NOR gate 100 in each bit transfer circuit 96 will indicate if an error has been made in the transfer of the data from the main memory to the memory interface. The output of each EXCLUSIVE NOR gate 100 is referred to as a syndrome bit, and the error control circuit 36 will provide seven syndrome bits, designated $S_1$–$S_7$, one syndrome bit from each bit transfer circuit 96. If any one of the data bits which are used to generate each ECC parity bit has arrived at the memory interface chip from main memory and is in error, the syndrome bit associated with such ECC parity bit at the output of EXCLUSIVE NOR gate 100 will be at a "one". By examining all of the syndrome bits, the location of a single error, and the existence of a double error, can be determined in accordance with the following rules:

1. If an odd number of syndrome bits are at a "1" logic level, a single data bit error has occurred.
2. If an even number of syndrome bits are at a "1" logic level, a double data bit error has occurred.
3. If all syndrome bits are at a "0" logic level, no error has occurred.

The location of any single bit in error is determined by decoding the seven syndrome bits. If a single error has occurred, the syndrome bits indicate that one of the 32 data bits $D_0$–$D_{31}$ is in error so that it may be corrected in a manner to be described in greater detail later.

The modified Hamming code chosen in the present embodiment and illustrated by the matrix in FIG. 3 is arranged such that a group comprised of the three syndrome bits $S_1$–$S_3$ will, when decoded for indicating a single bit in error, point to the same bit position in each of the four bytes of data received by memory interface chip 13a–13d. A group comprised of the remaining syndrome bits $S_4$–$S_7$ determine, along with bits $S_1$–$S_3$, which byte the single error has occurred in. This feature in correcting a single error can be seen by viewing the H-matrix in FIG. 3, where the patterns of "ones" and "zeros" in the first three rows for generating $C_1$, $C_2$ and $C_3$ are repetitive for byte 0 ($D_0$–$D_7$), byte 1 ($D_8$–$D_{15}$), byte 2 ($D_{16}$–$D_{23}$) and byte 3 ($D_{24}$–$D_{31}$). Thus, for each of the bytes 0, 1, 2 and 3, the syndrome bits $S_1$, $S_2$ and $S_3$, when indicating an error in a single bit location in any one of the bytes, will indicate the same bit location in each byte. As mentioned above, the actual byte where the error occurs is determined by also considering the remaining syndrome bits $S_4$–$S_7$.

The above feature of the illustrated modified Hamming code is particularly advantageous in providing single error correction in an LSI system, such as the preferred embodiment. This is illustrated by again referring to FIG. 5, where syndrome bits $S_1$, $S_2$ and $S_3$ are shown presented to the decoder 92 in each of the memory interface chips 13a–13d. Since the decoder in each memory interface chip receives the same signal (syndrome bits $S_1$, $S_2$ and $S_3$) to indicate the bit position of a single bit error, each of the LSI memory interface chips will have the same decoder logic circuitry and may be constructed identically. The advantage achieved by permitting as many LSI chips to be constructed identically as is possible has been noted earlier.

With regard to the decoder 92 in memory interface chip 13a illustrated in FIG. 5, each one of the eight possible combinations of the bits $S_1$-$S_3$ causes one of its output lines $S_{D0}$-$S_{D7}$ to be enabled. In addition, the error control circuit 36 includes a byte decoder and logic circuit 106 for receiving all the syndrome bits $S_1$-$S_7$, and in response, providing an enabling signal on one of four enable outputs. Each of the enable outputs of decoder 106 enables one of the decoders 92 in the four memory interface chips 13a–13d. The decoder and logic circuit 106 has appropriate logic circuitry for determining the byte whose memory interface chip decoder 92 is to be enabled in accordance with the logic equations in Table II.

Table II

Byte 0 = $S_4 \cdot \overline{S_5} \cdot S_7 + \overline{S_4} \cdot \overline{S_5} \cdot S_7 (S_1 + S_2 + S_3)$
Byte 1 = $S_4 \cdot \overline{S_5} \cdot S_7$
Byte 2 = $\overline{S_4} \cdot S_5 \cdot \overline{S_7} (S_1 + S_2 + S_3) + \overline{S_4} \cdot S_5 \cdot S_7$
Byte 3 = $S_4 \cdot S_5 \cdot \overline{S_7}$ A "1" for any one of the equations for Byte 0, Byte 1, Byte 2 or Byte 3 will cause the decoder 92 associated with the memory interface chip of that byte to be enabled.

When a particular bit position is indicated by the syndrome bits as in error, the EXCLUSIVE OR gate 86 in the bit transfer circuit 82 associated with that data bit causes the bit to be inverted. For example, if data bit $D_0$ is in error, the syndrome bits $S_1$-$S_7$ will cause decoder and logic circuit 106 to enable only the decoder 92 in the memory interface chip 13a and the syndrome bits $S_1$-$S_3$ will cause the output $S_{D0}$ of the decoder 92 in memory interface chip 13a to go to a "1". The logic level of the bit $D_0$, when passed through flip-flop 84 to the EXCLUSIVE OR gate 86, will be inverted by gate 86 and be passed on to the bus 41a for transfer to the ALU.

When an even number of the syndrome bits $S_1$-$S_7$ are at a "1", appropriate logic in the decoder and logic circuit 106 will cause a DOUBLE ERROR signal to be generated, indicating a double data bit error in the data fetched from main memory.

From the foregoing, it can be seen that the EDC circuit 30a can be made to generate ECC parity bits when data is passed along bus 32 from the memory interface 13 to the main memory, with the ECC parity bits passing through the NOR gate 98 in each of the seven transfer circuits 96 to bus 38 where the ECC bits are stored as check bits with data in the main memory. Furthermore, the EDC circuit 30a can be used with error control circuit 36 in performing an ECC parity check for single or double errors in data passing along bus 32 from the main memory to the memory interface, by generating ECC parity bits for the data so that a comparison can be made with the ECC check bits coming from the main memory on the bus 38. Such comparison is performed by the EXCLUSIVE NOR gate 100 in each of the seven transfer circuits 96, and the syndrome bits resulting from the comparison can be used to perform single error correction and double error detection.

Figure 6:
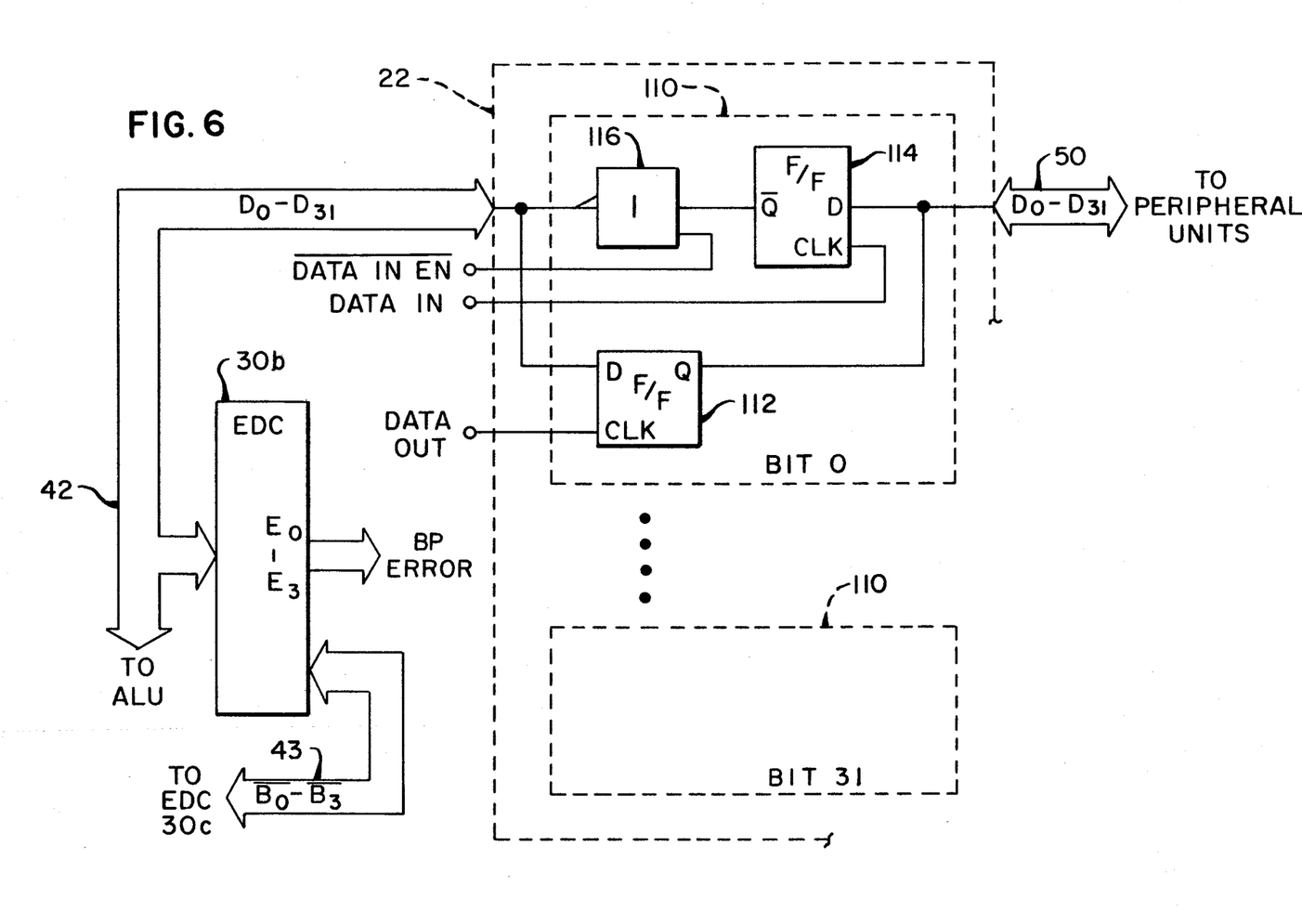
FIG. 6 is a block diagram illustrating the manner in which the error detection and correction circuit is connected when used in a byte parity mode.

In FIG. 6, there is illustrated in detail the connection of the EDC circuit 30b in the data processing system 10. The EDC circuit 30b operates in a byte parity mode, and in particular, provides byte parity bits for data on bus 42 leaving the I/O processor 22 for the ALU 12, and byte parity checking for the data on bus 42 entering the I/O processor 22 from the ALU 12. The connection of EDC circuit 30b was previously shown in general form in FIG. 1.

FIG. 6 shows a portion of the I/O processor 22, which includes a bidirectional bit transfer circuit 110 for each of the 32 data bits $D_0$-$D_{31}$ on bus 42. The illustrated transfer circuit 110 transfers the data bit $D_0$ and includes a flip-flop 112 for receiving at its input D the data bit $D_0$ from the bus 42. Th output Q of the flip-flop 112 is connected to the bus 50, and when a clocking signal, designated DATA OUT, is received at the input CLK of the flip-flop, indicating data is being transferred out of the ALU to peripheral units, the data bit $D_0$ is clocked into the flip-flop and presented to bus 50.

The transferred circuit 110 further includes a flip-flop 114 having its input D connected for receiving the bit $D_0$ from the bus 50, and its inverted output $\overline{Q}$ connected to an input of a NOR gate 116. The output of gate 116 is connected to bus 42. When an enabling signal $\overline{\text{DATA IN EN}}$, is received at a second input of the NOR gate 116, and a clocking signal DATA IN is received at the clocking input CLK of flip-flop 114, indicating data is being transferred into the ALU from the peripheral units, the data bit $D_0$ on bus 50 is transferred through flip-flop 114 and gate 116 to bus 42.

The bit transfer circuit 110 associated with each of the other data bits $D_1$-$D_{31}$ operates in the same fashion.

The operation of EDC circuit 30b for byte parity generating and checking has been described earlier with reference to FIG. 2. Briefly, when data is transferred from the I/O processor 22 to the ALU 12, the EDC circuit 30b will generate four inverted byte parity bits $\overline{B_0}$-$\overline{B_3}$ on the bus 43 for transmission with the data, which will be used for a parity check at EDC circuit 30c. When data is transferred along bus 42 from the ALU 12 to the I/O processor 22, the EDC circuit 30b will receive the inverted byte parity check bits $\overline{B_0}$-$\overline{B_3}$ from the EDC circuit 30c by way of the bus 43, and will perform an internal parity check by comparing the byte parity check bits on bus 43 with the byte parity bits generated internally in response to the received data bits $D_0$-$D_{31}$. A signal BP ERROR is generated on one of the terminals $E_0$-$E_3$ if the comparison indicates a byte parity error.

Figure 7A:
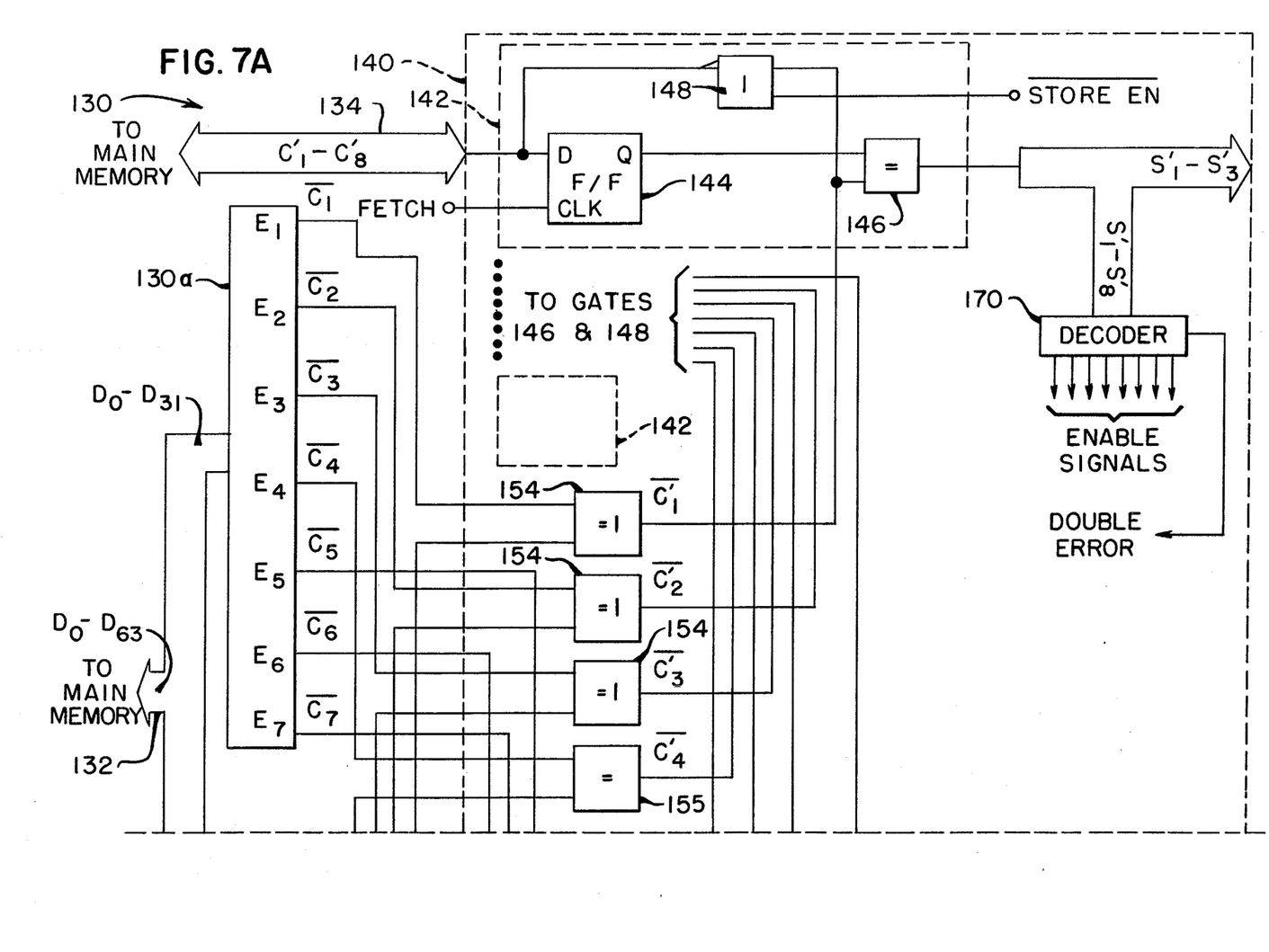
FIGS. 7A and 7B are a circuit block diagram illustrating the use of the error detection and correction circuit of FIG. 2 in a system having a 64 bit data bus.
Figure 7B:
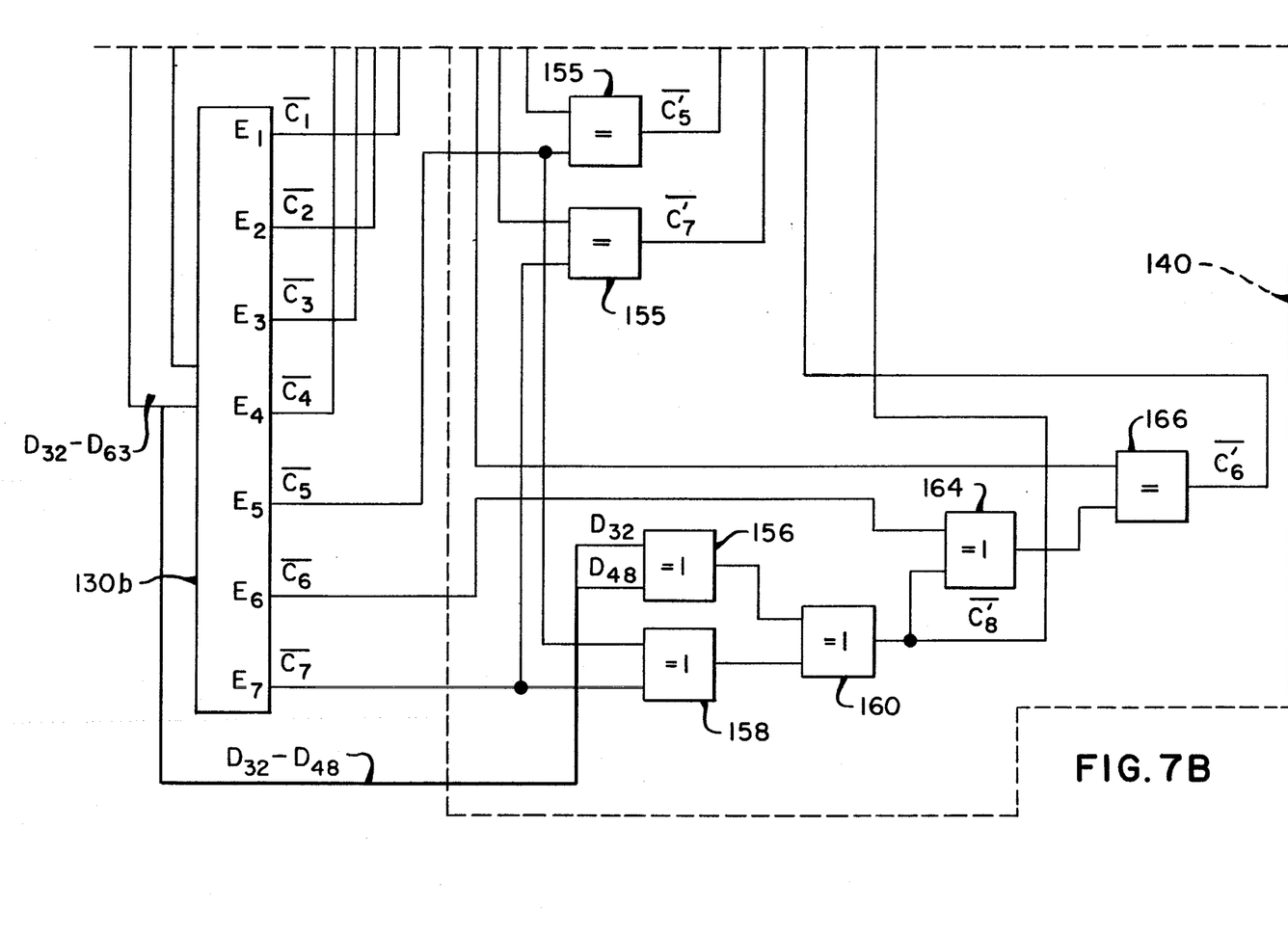

As noted earlier, the error detection and correction circuit of the present invention can be used in a system having a data bus larger than the data bus in the previously illustrated 32 bit system. FIGS. 7A and 7B show a 64 bit EDC circuit 130 operating in an ECC mode and having two EDC circuits 130a and 130b, each of the same construction and design as the EDC circuit 30 illustrated in FIG. 2. The circuit 130 generates eight inverted ECC parity bits $\overline{C'_1}$-$\overline{C'_8}$ and performs SEC/DED for 64 bits of data, $D_0$-$D_{63}$ from a data bus 132. A bus 134 carries ECC check bits $C'_1$-$C'_8$ to or from main memory.

As illustrated, the terminals $E_1$-$E_7$ are used in each of the circuits 130a and 130b and the $\overline{C_1}$-$\overline{C_7}$ bits on those terminals are presented, along with the $D_{32}$ and $D_{48}$ data bits, to a 64 bit connection logic and error control circuit 140. The circuit 140 includes a bit comparison and transfer circuit 142 for each of the eight pairs of corresponding ECC parity and check bits associated with the 64 bits of data. Each of the circuits 142 include a flip-flop 144, an EXCLUSIVE NOR gate 146, and a NOR gate 148.

In FIGS. 7A and 7B, only one of the circuits 142 is illustrated in detail. The flip-flop 144 in the illustrated circuit 142 receives the ECC check bit $C'_1$ from bus 134 at its input D, and if its clocking input CLK receives a clocking signal FETCH, indicating that data is being fetched from main memory and a check for error in such data is to be made, the ECC check bit $C'_1$ is clocked into the flip-flop and appears at the output Q. The output Q is connected to one input of the EXCLUSIVE NOR gate 146. The other input of the EXCLUSIVE NOR gate 146 receives the inverted ECC parity bit $\overline{C'_1}$ generated within the circuit 140, and the gate 146 performs a comparison and generates a syndrome bit $S'_1$.

If data is being transferred into main memory on bus 132, the ECC parity bits generated by circuit 140 are delivered to bus 134 to be transferred with the data as ECC check bits. In such case, the NOR gate 148 in each bit transfer circuit 142 receives an inverted ECC parity bit generated by circuit 140 at one of its inputs. When the other input of NOR gate 148 receives an enabling signal $\overline{\text{STORE EN}}$, indicating that data and check bits are to be stored in memory, each of the inverted ECC parity bits $\overline{C'_1}$-$\overline{C'_8}$ is inverted and passed by one of the gates 148 to the bus 134 as a check bit.

The connection logic and error control circuit 140 also includes three EXCLUSIVE OR gates 154 which receive the pairs of corresponding outputs $\overline{C_1}$, $\overline{C_2}$ and $\overline{C_3}$ of the circuits 130a and 130b and three EXCLUSIVE NOR gates 155 which receive the pairs of corresponding outputs $\overline{C_4}$, $\overline{C_5}$ and $\overline{C_7}$ of the circuits 130a and 130b. The outputs of the gates 154 provide the inverted ECC parity bits $\overline{C'_1}$, $\overline{C'_2}$ and $\overline{C'_3}$, and the outputs of the gates 155 provide the inverted ECC parity bits $\overline{C'_4}$, $\overline{C'_5}$ and $\overline{C'_7}$. As seen in FIG. 7B, an EXCLUSIVE OR gate 156 receives the data bits $D_{32}$ and $D_{48}$ and an EXCLUSIVE OR gate 158 receives the $\overline{C_5}$ and $\overline{C_7}$ bits from the circuit 130b. The outputs of the gates 156 and 158 are received by an EXCLUSIVE OR gate 160, which provides the signal $\overline{C'_8}$ at its output. The $\overline{C'_8}$ signal and the signal $\overline{C_6}$ from circuit 130b are provided to an EXCLUSIVE OR gate 164, and the output of gate 164 is provided, along with the $\overline{C_6}$ signal from circuit 130a to an EXCLUSIVE NOR gate 166. The output of gate 166 provides the signal $\overline{C'_6}$.

Figure 8A:
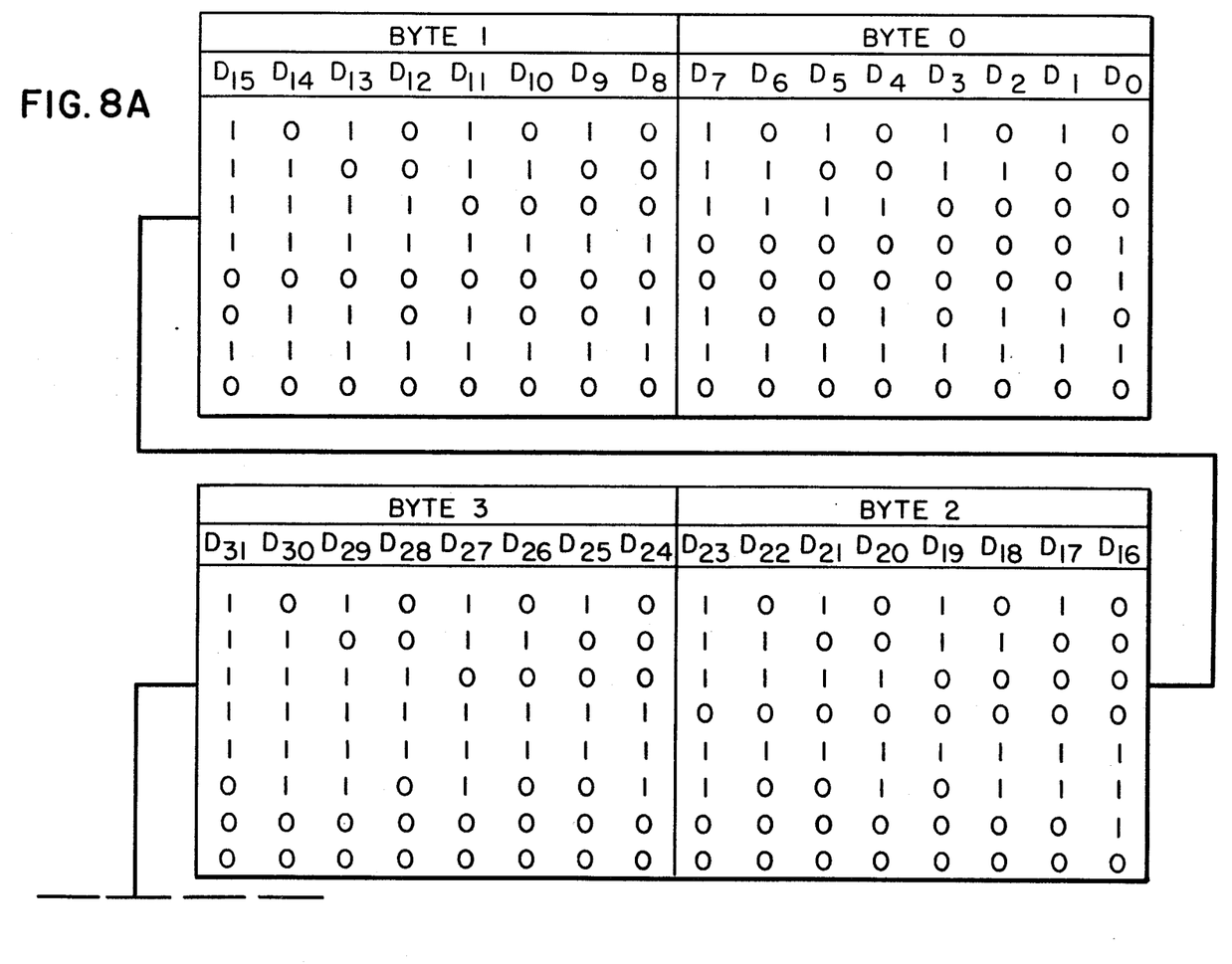
FIGS. 8A and 8B are an H-parity check matrix illustrating the modified Hamming code used in the circuit of FIGS. 7A and 7B.
Figure 8B:
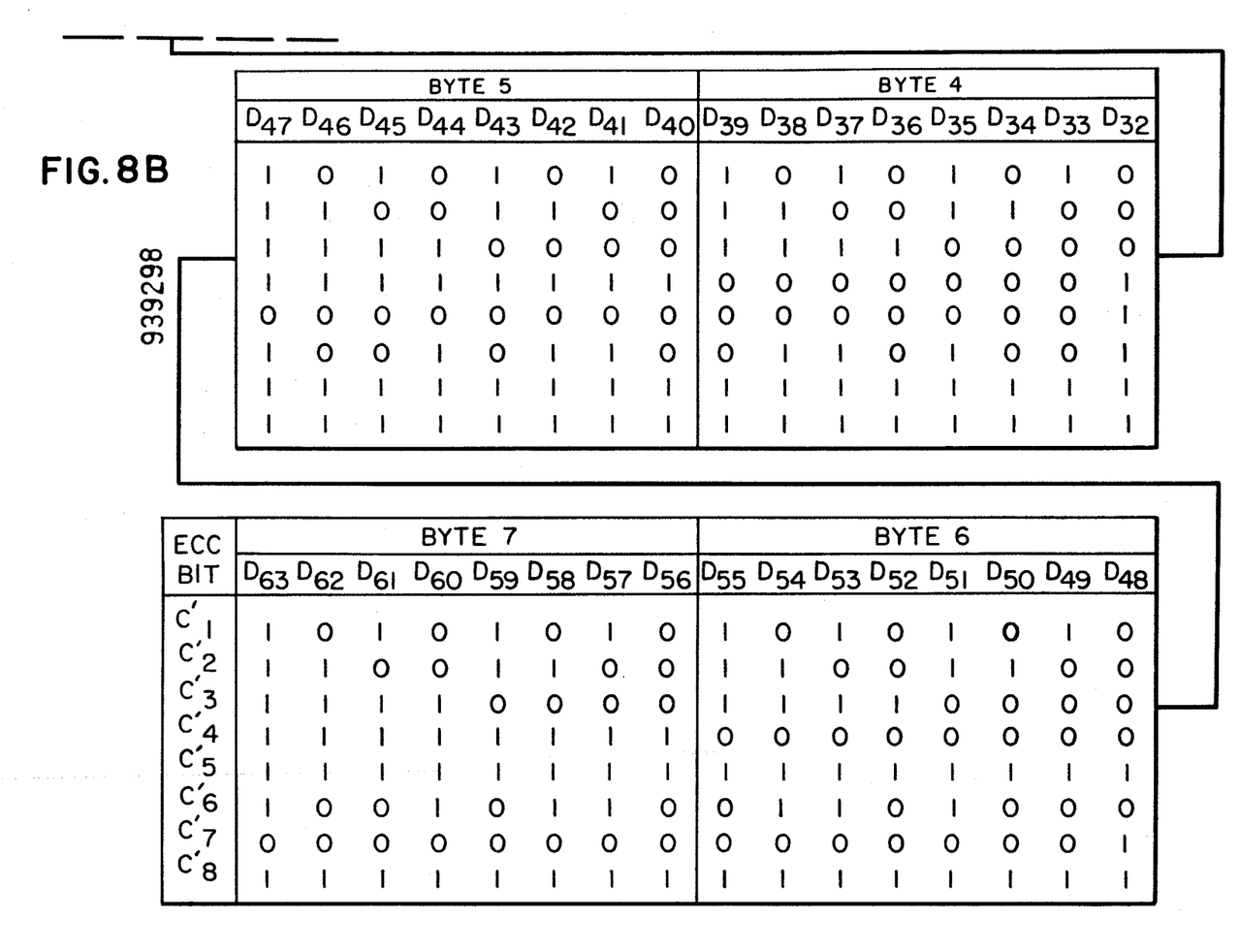

FIGS. 8A and 8B show an H parity check matrix illustrating the modified Hamming code used in the 64 bit EDC circuit 130 of FIGS. 7A and 7B. It can be seen from FIGS. 8A and 8B that, with the exception of the rows associated with $C'_6$ and $C'_8$, the pattern of "ones" and "zeros" for the data bits $D_{32}$-$D_{63}$ is substantially repetitive of the pattern for bits $D_0$-$D_{31}$, and that both are similar to the pattern of the 32 bit matrix of FIG. 3. As in FIG. 3, the "ones" indicate that the corresponding data bits are logically combined to generate each ECC parity bit, and "zeros" indicate that they are not.

The EXCLUSIVE OR gates 156, 158 and 160 in FIG. 7B generate $\overline{C'_8}$ by EXCLUSIVE ORing the data bits $D_{32}$, $D_{48}$ and all the data bits associated with $\overline{C_5}$ and $\overline{C_7}$ from EDC circuit 130b. The result, $\overline{C'_8}$ is an EXCLUSIVE ORing of all the data bits $D_{32}$-$D_{63}$. This is illustrated in the H-matrix in FIGS. 8A and 8B by the "ones" in the row associated with ECC parity bit $C'_8$.

The gates 164 and 166 generate $\overline{C'_6}$ by EXCLUSIVE ORing all the data bits associated with $\overline{C'_8}$, all the data bits associated with $\overline{C_6}$ from EDC circuit 130b and all the data bits associated with $\overline{C_6}$ from EDC circuit 130a. The result is the EXCLUSIVE ORing of the data bits corresponding to the "ones" in the row associated with ECC parity bit $C'_6$ in the matrix of FIGS. 8A and 8B.

The EDC circuit 130 works much like the circuit arrangement in FIG. 5. Eight syndrome bits ($S'_1$-$S'_8$) are generated by the gates 146 in the bit transfer circuits 142, and the syndrome bits $S'_1$-$S'_8$ are provided to a decoder and logic circuit 170. The decoder circuit 170 has eight enable signal outputs, each for enabling one of eight memory interface chips (not shown), and a ninth output for indicating a double error. The syndrome bits $S'_1$-$S'_3$ are provided to each memory interface chip, and if the memory interface chip is enabled, will cause correction of one of the eight data bits associated with that memory interface chip.

It should be noted that the syndrome bit $S'_8$ provides an indication of whether a bit error has occurred in either the data bits $D_1$-$D_{31}$ or the data bits $D_{32}$-$D_{63}$. This occurs because, as illustrated by the matrix in FIGS. 8A and 8B, all of the bits $D_{32}$-$D_{63}$ are used in generating $C'_8$. Thus, if an error occurs in any of the data bits $D_{32}$-$D_{63}$, $S'_8$ will be at a "1". If an error occurs in any of the data bits $D_0$-$D_{31}$, $S'_8$ will be at a "0".

It can thus be seen from the foregoing that the EDC circuit 30 can be used in a 32 bit data bus system and can be combined for use in systems having larger data busses, such as the illustrated 64 bit data bus system.

Although the presently preferred embodiments of the invention have been described, it will be understood that within the purview of this invention various changes may be made within the scope of the appended claims.

What is claimed is:

1. In a data processing system having a data bus carrying a plurality of data bits from a first location in the system to a second location in the system:
    error detection and correction bit means for providing a plurality of error correction code (ECC) parity bits in response to the receipt of the data bits from said data bus, said error detection and correction bit means including means for logically combining predetermined ones of the data bits in order to provide each of the ECC parity bits;
    error control means for receiving a plurality of ECC check bits associated with the data bits from the first location, for receiving the ECC parity bits from said error detection and correction bit means, for comparing the ECC parity bits and the ECC check bits, and for generating a plurality of syndrome bits indicating the bit position of any error in the data bits, the syndrome bits including a first group of syndrome bits indicating one of a plurality of groups of data bits where the error has occurred and a second group of syndrome bits indicating the bit position within one group of the data bits where the error has occurred; and
    a plurality of identical data receiving circuits at the second location, each of said data receiving circuits for receiving one of the plurality of groups of the data bits and being selectively enabled by the first group syndrome bits in order to correct any one of the data bits in its associated group of the data bits, said data receiving circuits each including identical bit decoder means for receiving the second group of syndrome bits.

2. The data processing system of claim 1, wherein said error detection and correction bit means includes EXCLUSIVE OR circuit means associated with each of the ECC parity bits for logically combining the predetermined ones of the data bits.

3. The data processing system of claim 1, wherein the plurality of data bits is 32 bits, wherein said error control means receives seven ECC parity bits and seven ECC check bits generates seven syndrome bits, and wherein each group in the plurality of data bits received by said data receiving circuits is eight data bits, and wherein the second group of syndrome bits is three syndrome bits.

4. The data processing system of claim 1, wherein said error control means includes byte decoder means for receiving the first group of syndrome bits and in response providing an enable signal to one of said data receiving circuits.

5. The data processing system of claim 1, wherein each of said data receiving circuits includes means responsive to said bit decoder means for inverting any one of the bits in its one of the plurality of groups of data bits.

6. A data processing system, comprising:
a processor;
a memory for storing data words, each data word comprising a plurality of data bits;
a data bus for transferring a data word from said memory;
error detection and correction bit means for receiving the data word on said data bus and in response generating a plurality of error correction code (ECC) parity bits, each of the ECC parity bits generated by logically combining predetermined data bits in the data word;
error control means for receiving the plurality of ECC parity bits from said error detection and correction bit means and a plurality of ECC check bits from said memory, for comparing the ECC parity bits and the ECC check bits, and for generating a plurality of syndrome bits indicating the bit position of an error in the data word on said bus, the plurality of syndrome bits including a first group of syndrome bits indicating one of a plurality of groups of the data bits in the data word where an error has occurred and a second group of syndrome bits indicating the bit position within one of the groups of data bits in the data word where an error has occurred; and
a memory interface for receiving the data word from said data bus and transferring the data word to said processor, said memory interface comprising a plurality of LSI memory interface circuits, each of said memory interface circuits for receiving a different one of the groups of the data bits in the data word and being selectively enabled by the first group of syndrome bits for correcting an error in any one of the data bits, with each of said memory interface circuits including an identical bit decoder means for receiving the second group of syndrome bits.

7. The data processing system of claim 6, wherein each of said memory interface circuits receives one byte of data bits and wherein the data word is comprised of four bytes of data bits.

8. The data processing system of claim 6, wherein said error detection and correction bit means comprises two error detection and correction bit circuits, wherein the data word is comprised of eight bytes of data bits, and wherein each of said two error detection and correction bit circuits receives four bytes of data bits and generates seven ECC parity bits for its four bytes of data bits.

9. The data processing system of claim 8, wherein said error detection and correction bit means further comprises connection logic means for receiving and logically combining the seven ECC parity bits generated by each of said two error detection and correction bit circuits to provide eight ECC parity bits for the eight bytes of data in the data word.

10. The data processing system of claim 6, wherein said error detection and correction bit means comprises two error detection and correction bit circuits, with each error detection and correction bit circuit for receiving four bytes of data bits, wherein the first group of syndrome bits comprises seven bits and wherein the second group of syndrome bits comprises three bits within the first group of syndrome bits.

11. The data processing system of claim 10, wherein the plurality of syndrome bits includes an eighth syndrome bit for indicating in which four bytes of data bits received by said two error detection and correction bit circuits the bit position of the error is located.

12. The data processing system of claim 6, wherein each group of the data bits in the data word is a byte of data bits and wherein said error detection and correction bit means includes means for logically combining the data bits in each of the bytes for generating byte parity bits.

13. The data processing system of claim 12, wherein said error detection and correction bit means includes means for selectively providing the ECC parity bits and the byte parity bits.

* * * * *